United States Patent
Lang et al.

(10) Patent No.: US 9,851,221 B2
(45) Date of Patent: Dec. 26, 2017

(54) HALL SENSOR INSENSITIVE TO EXTERNAL MAGNETIC FIELDS

(71) Applicant: Robert Bosch GmbH, Stuttgart (DE)

(72) Inventors: Norbert Lang, Eberdingen (DE); Johannes Maess, Stuttgart (DE); Thomas Boehringer, Illingen (DE); Frank Sandmann, Vaihingen (DE); Thomas Klotzbuecher, Rudersberg (DE)

(73) Assignee: Robert Bosch GmbH, Stuttgart (DE)

( * ) Notice: Subject to any disclaimer, the term of this patent is extended or adjusted under 35 U.S.C. 154(b) by 70 days.

(21) Appl. No.: 14/780,175

(22) PCT Filed: Mar. 3, 2014

(86) PCT No.: PCT/EP2014/054078
§ 371 (c)(1),
(2) Date: Sep. 25, 2015

(87) PCT Pub. No.: WO2014/154446
PCT Pub. Date: Oct. 2, 2014

(65) Prior Publication Data
US 2016/0041007 A1     Feb. 11, 2016

(30) Foreign Application Priority Data

Mar. 26, 2013   (DE) .................. 10 2013 205 313

(51) Int. Cl.
*G01R 33/07* (2006.01)
*G01D 5/14* (2006.01)

(52) U.S. Cl.
CPC ............ *G01D 5/145* (2013.01); *G01R 33/07* (2013.01); *G01R 33/075* (2013.01); *G01R 33/077* (2013.01)

(58) Field of Classification Search
CPC ................................ G01D 5/145; G01R 33/07
(Continued)

(56) References Cited

U.S. PATENT DOCUMENTS

| 7,208,939 B2* | 4/2007 | Frederick | G01D 5/24438 |
| | | | 324/207.2 |
| 7,235,968 B2* | 6/2007 | Popovic | G01R 33/077 |
| | | | 324/247 |
| 2014/0225596 A1* | 8/2014 | Nakamura | G01R 33/07 |
| | | | 324/207.2 |

FOREIGN PATENT DOCUMENTS

| JP | 3-176682 A | 7/1991 |
| JP | 2002-71381 A | 3/2002 |

(Continued)

OTHER PUBLICATIONS

International Search Report corresponding to PCT Application No. PCT/EP2014/054078, dated Jun. 12, 2014 (German and English language document) (5 pages).

(Continued)

*Primary Examiner* — Reena Aurora
(74) *Attorney, Agent, or Firm* — Maginot, Moore & Beck LLP

(57) ABSTRACT

A Hall sensor includes a first Hall element pair configured to provide a first measurement signal, a second Hall element pair configured to provide a second measurement signal, and a third Hall element pair configured to provide a third measurement signal. Each element in the third Hall element pair is arranged between Hall elements of the first Hall element pair and Hall elements of the second Hall element pair. The Hall element pairs are configured to be actuated such that the first, second, and third measurement signals can be combined into one aggregate measurement signal (Continued)

which corrects an error in an angle of rotation determination caused by an external magnetic field.

10 Claims, 3 Drawing Sheets

(58) Field of Classification Search
USPC .............................................. 324/251, 207.2
See application file for complete search history.

(56) References Cited

FOREIGN PATENT DOCUMENTS

| | | |
|---|---|---|
| JP | 2005-315696 A | 11/2005 |
| JP | 2007-271443 A | 10/2007 |
| JP | 2011-169813 A | 9/2011 |
| WO | 2012/019958 A2 | 2/2012 |

OTHER PUBLICATIONS

Banjevic M. et al.; 2D CMOS Integrated Magnetometer Based on the Miniaturized Circular Vertical Hall Device; Solid-State Sensors, Actuators and Microsystems Conference 2009; Jun. 21, 2009; pp. 877-880; IEEE, Piscataway, New Jersey, U.S.

Kejik P. et al.; Circular Hall Transducer for Angular Position Sensing; Transducers & Eurosensors 2007; Jun. 10, 2007; pp. 2593-2596; IEEE, Piscataway, New Jersey, U.S.

* cited by examiner

HALL SENSOR INSENSITIVE TO EXTERNAL MAGNETIC FIELDS

This application is a 35 U.S.C. §371 National Stage Application of PCT/EP2014/054078, filed on Mar. 3, 2014, which claims the benefit of priority to Serial No. DE 10 2013 205 313.4, filed on Mar. 26, 2013 in Germany, the disclosures of which are incorporated herein by reference in their entirety.

BACKGROUND

Hall sensors are used in many areas of technology. For example, Hall sensors are used to contactlessly detect rotary movements and in particular angle of rotation.

The measurement signal of Hall sensors is dependent on a magnetic field. Therefore Hall sensors are generally sensitive to interference fields, which can be caused for example by current-carrying lines or magnets in the surroundings of the Hall sensor. For example an interference field on a Hall sensor can result in erroneous angle measurement values.

SUMMARY

There can therefore be a need for an improved Hall sensor and an improved manufacturing method for a Hall sensor, which in particular guarantee a lower sensitivity of the sensor measurement values to interference fields.

Said requirement can be met by the subject matter of the present disclosure. Advantageous embodiments of the present disclosure are described in the detailed description, the drawings, and the claims.

Features, particulars and possible advantages of an apparatus according to embodiments of the disclosure are discussed in detail below.

According to a first aspect of the disclosure, a Hall sensor is presented. The Hall sensor comprises a first Hall element pair that is implemented to provide a first measurement signal. The Hall sensor further comprises a second Hall element pair that is implemented to provide a second measurement signal. Furthermore, the Hall element comprises at least one further Hall element pair that will be referred to as a third Hall element pair. The third Hall element pair is implemented to provide a third measurement signal. In this case the Hall elements of the third Hall element pair are each disposed between Hall elements of the first Hall element pair and of the second Hall element pair. The Hall element pairs can be activated such that the first measurement signal, the second measurement signal and the third measurement signal can be combined to form a total measurement signal that takes into account an error caused by an external magnetic field.

In other words, the idea of the present disclosure is based on providing at least one further Hall element pair compared to known embodiments with two Hall element pairs and to use its measurement data in combination with the other two measurement signals to eliminate an error caused by an external magnetic field. In this case the Hall element pairs are disposed with an angular offset relative to each other, so that by comparison of the individual measurement values, for example a stationary or static external magnetic field can be distinguished from a field of a rotating magnet associated with the Hall sensor for angle measurement.

Owing to the design of the Hall sensor with additional Hall element pairs, the calculation of the total measurement signal can be implemented so as to be insensitive to external magnetic fields. Furthermore, the Hall sensors according to the disclosure are not associated with extra costs compared to known sensors.

For example, the Hall sensors according to the disclosure can be used in vehicle technology. In particular, said improved Hall sensors can be used advantageously in hybrid vehicles and in electric vehicles. Because many current-carrying lines, permanent magnets, electromagnets and power electronics are provided in hybrid and electric vehicles, interactions can occur between the Hall sensor and said elements. The Hall sensor according to the disclosure takes account of said interactions and compensates for them during the calculation of the total measurement signal.

For example, the Hall sensor can be used for angle determination in electrical choke devices and electrical control flaps, in particular in choke flaps. Furthermore, the Hall sensor can be used for determining an angular position of a final control element (GPA, general purpose actuator) for valves. Furthermore, the Hall sensor can be used in accelerator pedal modules (APM) or in pedal value encoders (PVE).

Furthermore, the Hall sensor can be used for determining a revolution rate of an electric motor, for determining a rotational frequency of a wheel in ABS applications or for measuring a torque of a torsion rod in a steering column of a motor vehicle.

The Hall sensor can be implemented as a field strength dependent or preferably as a field direction dependent Hall sensor. The Hall sensor comprises Hall elements. If a current flows through said Hall elements and if a magnetic field passes through the same, for example perpendicularly, then they provide measurement signals corresponding to an output voltage that is proportional to the product of the magnetic field strength and the current.

Furthermore, the Hall sensor can be implemented as a spinning current Hall sensor. In this case each of a plurality of connections can be used as a power supply and each of a plurality of connections as a Hall voltage pickup. The functions of the connections can be changed around. An offset voltage can be significantly reduced by suitable analysis of the measurement results.

The Hall elements of the Hall sensor are combined to form Hall element pairs. The Hall element pairs can each comprise two possibly identical and mutually opposing Hall elements. In this case, the Hall elements of a Hall element pair can be disposed on a connecting line or at a 180° angle. The connecting lines of the Hall elements of the first Hall element pair and the Hall elements of the second Hall element pair can intersect. Furthermore, the connecting line of the Hall elements of the third Hall element pair can cross the connecting lines of the other Hall element pairs.

In this case the Hall element can be a stationary component that is fixedly connected to the surrounding structures. It can determine the rotation angle position of a component. For this purpose, for example a permanent magnet with a predetermined magnetic field direction can be fixed on the rotating component. A first measurement signal is determined using the first Hall element pair during rotation of the component and hence of the permanent magnet, said signal corresponding for example to a sine value or an x value of the magnetic field direction. Using the second Hall element pair a second measurement signal is determined, corresponding for example to a cosine value or a y value of the magnetic field direction. The third measurement signal that is determined using the third Hall element pair can for example also represent a sine or x value of the magnetic field direction and can be used for comparison with the first measurement signal. If there is no external magnetic field on the Hall sensor, then the first measurement signal corresponds to the third measurement signal. If however there is an external magnetic field, then the third measurement signal deviates from the first measurement signal. The effect of the external magnetic field can be determined from the deviation of said measurement signals from each other and from the known position of the individual Hall elements on the Hall sensor.

In this way errors in the total measurement signal caused by the external magnetic field can be taken into account, i.e. can be eliminated by calculation or compensated for, for example using a certain calculation algorithm. For example, the total measurement signal corresponds in this case to the angle of rotation of a component to be determined by the Hall sensor.

The external magnetic field, also referred to as the interference field, can be caused by a current-carrying line running close to the Hall sensor for example. The magnetic field direction of the external magnetic field is static, whereas the field strength of the external magnetic field can vary.

According to one exemplary embodiment of the disclosure, the first, the second and the third measurement signals are dependent on the magnetic field direction of the sensor magnet. I.e. the measurement signals represent an orientation of the sensor magnetic field.

According to another exemplary embodiment of the disclosure, the Hall sensor comprises a fourth Hall element pair, which is implemented to provide a fourth measurement signal that may be dependent on the magnetic field direction. The Hall elements of the fourth Hall element pair are in this case each disposed between Hall elements of the first Hall element pair and of the second Hall element pair. The effect of an external magnetic field can be compensated better by said further Hall element pair. For an additional improvement of the correction of the overall measurement value, the Hall element can comprise any number of further Hall element pairs.

In particular, the fourth measurement signal can for example also represent a cosine or y value of the magnetic field direction and can be used for comparison with the second measurement signal. If there is no external magnetic field on the Hall sensor, then the fourth measurement signal corresponds to the second measurement signal. If, however, there is an external magnetic field, then the measurement signals deviate from each other. The effect of the external magnetic field can be determined yet more accurately from the deviation and from the known position of the individual Hall elements.

According to another exemplary embodiment of the disclosure, the first Hall element pair is disposed on the Hall sensor so as to be offset by 90° relative to the second Hall element pair. The third Hall element pair is further disposed so as to be offset by 45° relative to the first Hall element pair. For example, the individual Hall elements can be disposed on the circumference of a circle. Furthermore, the fourth Hall element pair can be disposed so as to be offset by −45° relative to the first Hall element pair. I.e. the third and the fourth Hall element pairs are offset by 90° relative to each other. The individual positions of the Hall elements are thereby known.

According to another exemplary embodiment of the disclosure, the Hall sensor also comprises a measuring device. In this case the measuring device is implemented to determine the first measurement signal, the second measurement signal, the third measurement signal and possibly also the fourth measurement signal and to combine the same to form a total measurement signal such that an error caused by an external magnetic field is minimized in the total measurement signal.

The measuring device for this can be a microprocessor unit for example. In particular, the measuring device can be implemented as part of an application specific integrated circuit (ASIC). The measuring device can determine or read out the measurement signals simultaneously or sequentially. Furthermore, the measuring device can apply a calculation algorithm to the determined measurement signals, so that the error caused by the external magnetic field is minimized in the resulting total measurement signal. For example, the calculation algorithm can determine an external magnetic field-free sine measurement value of the magnetic field by additions, subtractions and averaging between the first and the third measurement signals. Accordingly, the cosine measurement value can also be determined using the second and the fourth measurement signals. Then an arcus tangent can be formed, so that the total measurement signal that is output represents an angle of rotation of the component that is provided with a permanent magnet.

According to another exemplary embodiment of the disclosure, the Hall sensor is implemented as part of an application specific integrated circuit. I.e. the Hall sensor can be integrated within power electronics or control electronics.

According to a second aspect of the disclosure, a method for manufacturing a Hall sensor as described above is presented. The method comprises the following steps: providing a first Hall element pair that is implemented to provide a first measurement signal; providing a second Hall element pair that is implemented to provide a second measurement signal; providing a third Hall element pair that is implemented to provide a third measurement signal; disposing each Hall element of the third Hall element pair between Hall elements of the first Hall element pair and of the second Hall element pair; configuring the Hall element pairs to be activated such that the first measurement signal, the second measurement signal and the third measurement signal can be combined to form a total measurement signal that takes into account an error caused by an external magnetic field.

According to a third aspect of the disclosure, the use of the Hall sensor described above for angle measurement in a hybrid vehicle or in an electric vehicle is presented.

BRIEF DESCRIPTION OF THE DRAWING

Other features and advantages of the present disclosure will become apparent to the person skilled in the art from the following description of exemplary embodiments with reference to the accompanying figures; however said exemplary embodiments are not to be interpreted as limiting the disclosure.

DETAILED DESCRIPTION

All figures are only schematic representations of apparatuses according to the disclosure or their components according to exemplary embodiments of the disclosure. In particular, distances and dimensional relationships are not reproduced to scale in the figures. Corresponding elements are provided with the same reference numbers in the different figures.

Figure 1:
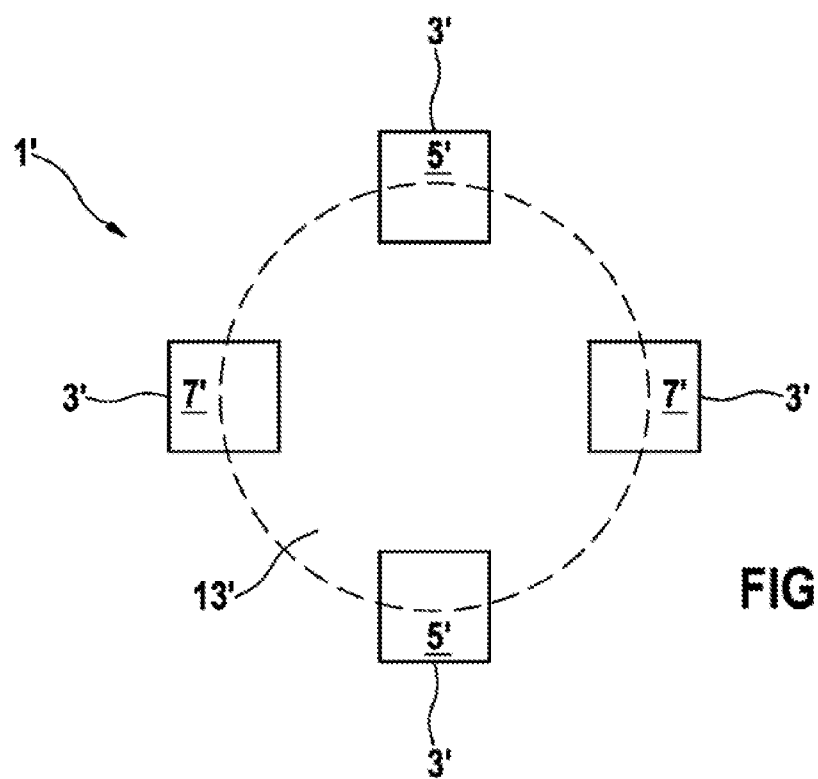
FIG. 1 shows a plan view of a known Hall element

A known Hall sensor 1' is shown in FIG. 1. The Hall sensor 1' is implemented as a field direction dependent sensor and comprises four Hall elements 3' that are disposed on a radius at an angle of 90°. Each two mutually opposing Hall elements 3' together provide an output signal or an output voltage. Owing to the arrangement of the Hall elements 3' being mutually offset by 90°, a sine signal and a cosine signal result.

Figure 2:
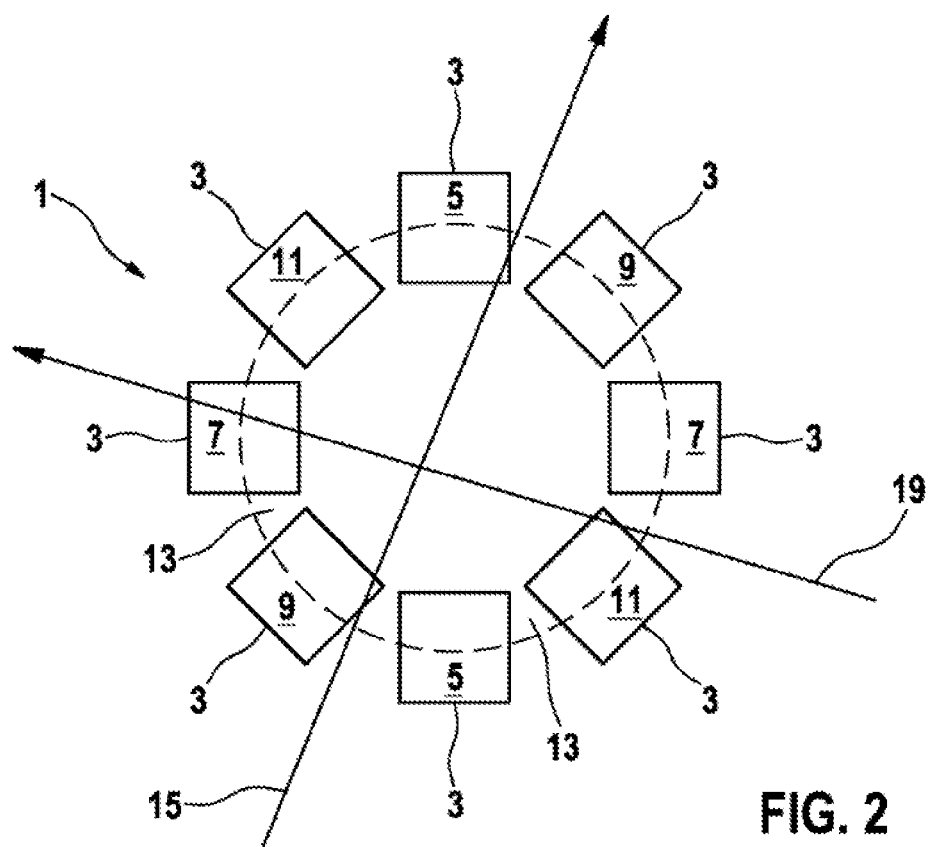
FIG. 2 shows a plan view of a Hall element with four Hall element pairs according to an exemplary embodiment of the disclosure

The measurement signals of the Hall elements 3' are dependent on the direction of the magnetic field of a permanent magnet attached to a component. This enables the angular position of the permanent magnet and hence of the component, for example of a valve, to be determined. Because of the dependency of the Hall element 3' on the magnetic field direction, the Hall sensor 1' is sensitive to magnetic interference fields or external magnetic fields 19. An external magnetic field 19 can for example be caused by a current-carrying line running close to the Hall sensor 1'. In particular, the stationary external magnetic field 19 and the magnetic field 15 of the rotating permanent magnet can be superimposed as shown in FIG. 2. This can result in errors in the output signal of the Hall sensor 1', i.e. for example in an incorrect angle indication of the angular position of the component with a permanent magnet.

Figure 3:
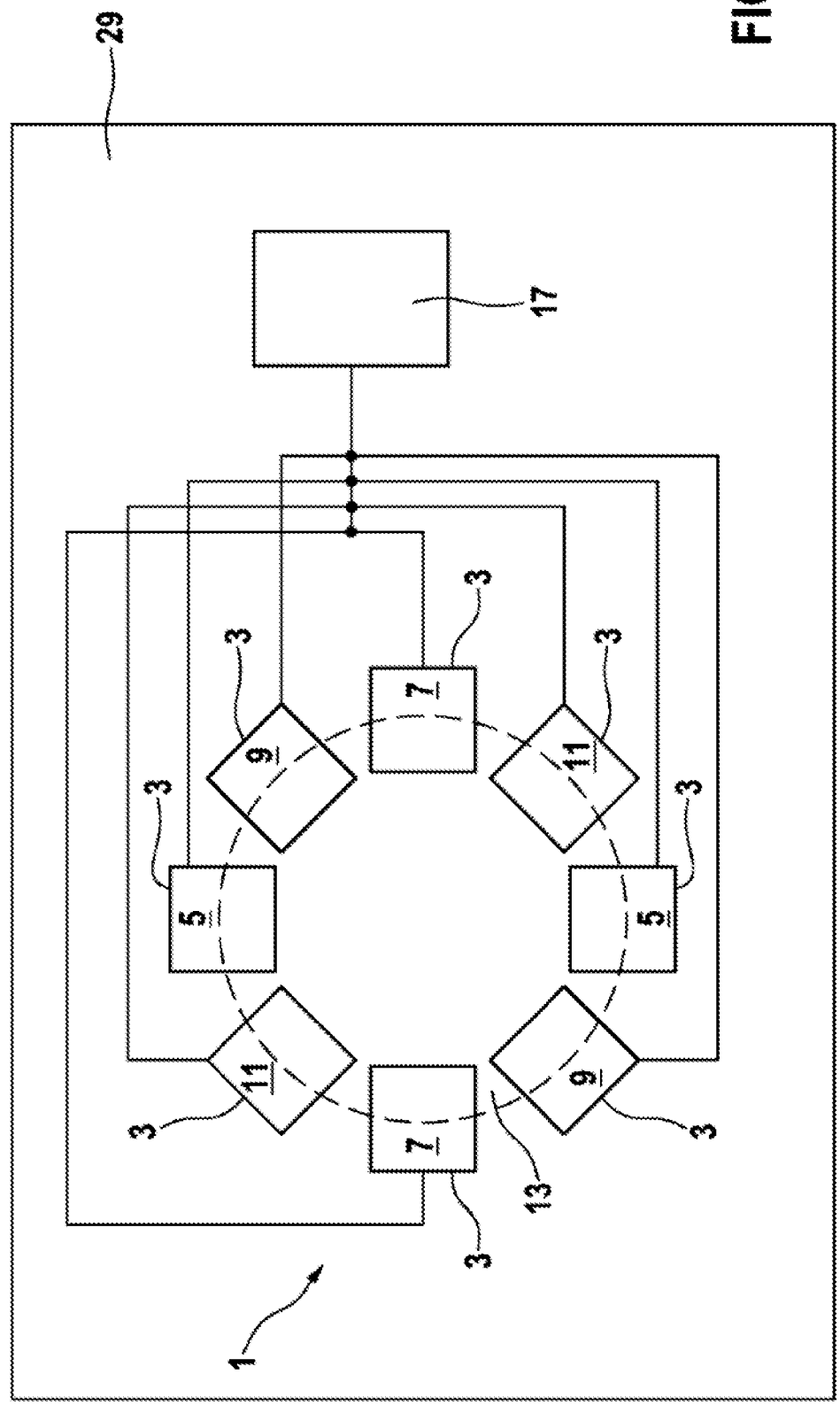
FIG. 3 shows the Hall element of FIG. 2 as part of an application specific integrated circuit
Figure 4:
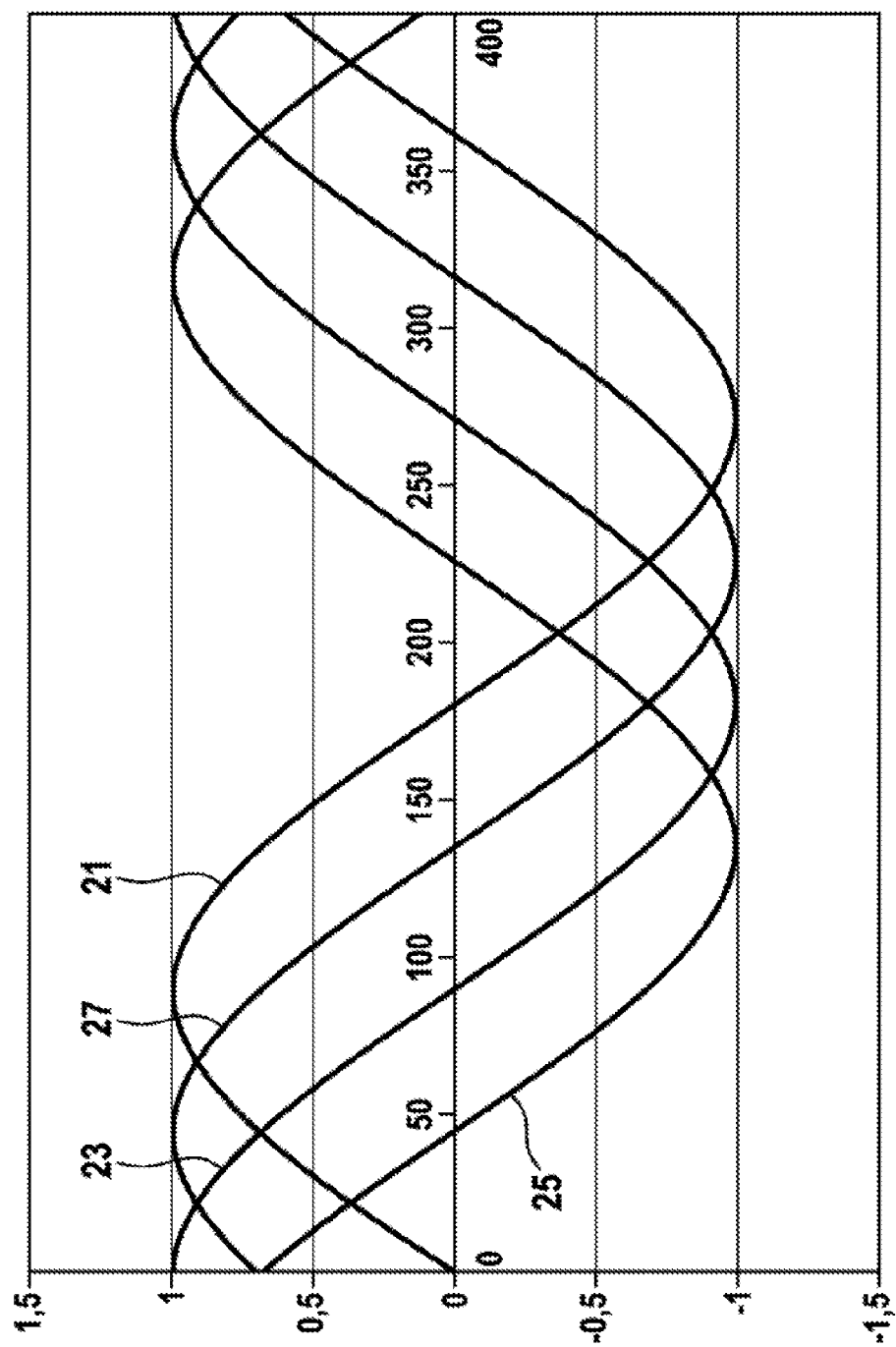
FIG. 4 shows the measurement signals of the individual Hall element pairs of the Hall sensor from FIG. 2.

The Hall sensor according to the disclosure 1, which is explained in detail using FIGS. 2 through 4, is implemented to reduce the influence of the external magnetic field 19 on the output or total measurement signal of the Hall sensor 1.

As shown in FIG. 2, the Hall sensor 1 comprises a first Hall element pair 5 that is implemented to provide a first measurement signal 21. Furthermore, the Hall sensor 1 comprises a second Hall element pair 7 that is implemented to provide a second measurement signal 23. Furthermore, the Hall element 1 comprises a third Hall element pair 9 that is implemented to provide a third measurement signal 25. Finally, the Hall element 1 comprises a fourth Hall element pair 11 that is implemented to provide a fourth measurement signal 27.

The Hall element pairs 5, 7, 9, 11 each comprise two Hall elements 3 that are arranged opposite each other. In this case the Hall elements 3 are disposed on an integrated flux conductor 13, which is circular for example. The flux conductor 13 amplifies the magnetic fields in the region of the Hall elements 3.

The first Hall element pair 5 is disposed so as to be offset relative to the second Hall element pair 7 by 90°. I.e. if one Hall element 3 of the first Hall element pair 5 is disposed at 0° and the other Hall element 3 is disposed at 180°, then one Hall element 3 of the second Hall element pair 7 is disposed at 90° and the other Hall element 3 is disposed at 270°.

The first and second Hall element pairs 5, 7 produce main characteristics for this. For example, the first Hall element pair 5, as shown in FIG. 4, produces a sine signal, also referred to as a first measurement signal 21. The second Hall element pair 7 produces a cosine signal, also referred to as a second measurement signal 23. Owing to the external magnetic field 19, said characteristics are delayed or consumed and cause an incorrect angle indication in the calculation. At least one additional Hall element pair is used to reduce the influence of the external magnetic field 19 on the calculated angle indication. In the exemplary embodiment in FIG. 2, two additional Hall element pairs 9, 11 are provided.

The Hall elements 3 of said additional Hall element pairs 9, 11 are disposed in the gaps of the first and second Hall element pairs 5, 7.

The Hall elements 3 of the third Hall element pair 9 and of the fourth Hall element pair 11 are each disposed between the Hall elements 3 of the first and second Hall element pairs 5, 7. I.e. for example, so that a Hall element 3 of the third Hall element pair 9 is disposed at 45° and the other Hall element 3 is disposed at 225°. Furthermore, a Hall element 3 of the fourth Hall element pair 11 is disposed at 135° and the other Hall element of said Hall element pair 11 is disposed at 315°.

The two additional Hall element pairs 9, 11 each enable another sinusoidal signal and another cosinusoidal signal to be read out. The sinusoidal signal provided by the third Hall element pair 9 is also referred to as the third measurement signal 25. The cosinusoidal signal provided by the fourth Hall element pair 11 is also referred to as the fourth measurement signal 27. The Hall element 1, as shown in FIG. 4, provides two sinusoidal and two cosinusoidal characteristics in total.

The Hall element pairs 5, 7, 9, 11 can be activated such that the first measurement signal 21, the second measurement signal 23, the third measurement signal 25 and possibly the fourth measurement signal 27 can be combined to form a total measurement signal that takes into account an error caused by the external magnetic field 19. I.e. during the calculation of the total measurement signal, the individual measurement signals 5, 7, 9, 11 are combined or compared, for example using a calculation algorithm, such that the external magnetic field 19 has no influence or a significantly reduced influence on the total measurement signal. During this, knowledge of the positions of the Hall elements 3 or the Hall element pairs 5, 7, 9, 11 is included in the calculation. Furthermore, during the calculation it is taken into account that the external magnetic field 19 is a magnetic field that does not perform a change of direction, whereas the magnetic field 15 of the rotating component having a permanent magnet is a displaced magnetic field that undergoes a change of direction. For example, the total measurement signal can be based on the formation of a sum and arctangent of the sine and cosine signals.

The calculated total measurement signal is thus relatively insensitive to external magnetic fields 19. This can in particular be advantageous when using the Hall sensor 1 in hybrid or in electric vehicles, because in said vehicles in particular many electrical lines and power electronics act as sources of external magnetic fields 19.

FIG. 3 shows an exemplary embodiment in which the Hall sensor 1 is implemented as part of an ASIC 29. Here a measuring device 17 that is also integrated within the ASIC 29 can read out the individual measurement signals 21, 23, 25, 27. Furthermore, a microprocessor, which can also be implemented as part of the ASIC 29, can perform the calculation algorithm and output the total measurement signal. The measuring device 17 can be integrated within the microprocessor for this or can be implemented as a microprocessor.

The measurement signals 21, 23, 25, 27 of the individual Hall element pairs 5, 7, 9, 11 are shown in FIG. 4. In this case an angle is plotted in ° on the x axis and the Hall voltage is plotted in V on the y axis.

Finally it is noted that expressions such as "having" or similar shall not exclude other elements or steps from being provided. Furthermore, it should be noted that "one" or "a" does not exclude any number. Moreover, features described in connection with the various embodiments can be com-

The invention claimed is:

1. A Hall sensor, comprising:
   a first Hall element pair configured to provide a first measurement signal;
   a second Hall element pair configured to provide a second measurement signal;
   a third Hall element pair configured to provide a third measurement signal, the Hall elements of the third Hall element pair disposed between Hall elements of the first Hall element pair and Hall elements of the second Hall element pair; and
   a measuring device connected to the first Hall element pair, the second Hall element pair, and the third Hall element pair, the measuring device being configured to (i) simultaneously receive the first measurement signal, the second measurement signal, and the third measurement signal and (ii) combine the first measurement signal, the second measurement signal, and the third measurement signal to form the total measurement signal using a calculation that takes into account positions of the first Hall element pair, the second Hall element pair, and the third Hall element pair, such that an error in the resulting total measurement signal caused by an external magnetic field is minimized.

2. The Hall sensor as claimed in claim 1, wherein the first measurement signal, the second measurement signal and the third measurement signal are magnetic field direction dependent signals.

3. The Hall sensor as claimed in claim 1, further comprising:
   a fourth Hall element pair that is configured to provide a fourth measurement signal;
   wherein Hall elements of the fourth Hall element pair are each disposed between the Hall elements of the first Hall element pair and the Hall of the second Hall element pair.

4. The Hall sensor as claimed in claim 3, wherein the first, second, third, and fourth Hall element pairs are disposed such that each of the four measurement signals enables compensation of one of the other three measurement signals.

5. The Hall sensor as claimed in claim 1, wherein:
   the first Hall element pair is offset by 90° relative to the second Hall element pair; and
   the third Hall element pair is offset by 45° relative to the first Hall element pair.

6. The Hall sensor as claimed in claim 1, wherein the Hall sensor is implemented as part of an application specific integrated circuit.

7. A method for manufacturing a Hall sensor, the method comprising:
   providing a first Hall element pair configured to provide a first measurement signal;
   providing a second Hall element pair configured to provide a second measurement signal;
   providing a third Hall element pair configured to provide a third measurement signal;
   disposing each Hall element of the third Hall element pair between Hall elements of the first Hall element pair and Hall elements of the second Hall element pair; and
   providing a measuring device connected to the first Hall element pair, the second Hall element pair, and the third Hall element pair, the measuring device being configured to (i) simultaneously receive the first measurement signal, the second measurement signal, and the third measurement signal and (ii) combine the first measurement signal, the second measurement signal, and the third measurement signal to form the total measurement signal using a calculation that takes into account positions of the first Hall element pair, the second Hall element pair, and the third Hall element pair, such that an error in the resulting total measurement signal caused by an external magnetic field is minimized.

8. A method of using a Hall sensor, the method comprising:
   activating a first Hall element pair to produce a first measurement signal;
   activating a second Hall element pair to produce a second measurement signal;
   activating a third Hall element pair to produce a third measurement signal, wherein Hall elements of the third Hall element pair are disposed between Hall elements of the first Hall element pair and Hall elements of the second Hall element pair;
   simultaneously receiving the first measurement signal, the second measurement signal, and the third measurement signal with a measuring device connected to the first Hall element pair, the second Hall element pair, and the third Hall element pair; and
   combining, with the measuring device, the first measurement signal, the second measurement signal, and the third measurement signal to form the total measurement signal using a calculation that takes into account positions of the first Hall element pair, the second Hall element pair, and the third Hall element pair, such that an error in the resulting total measurement signal caused by an external magnetic field is minimized.

9. The method of using a Hall sensor according to claim 8, wherein the method is used for angle measurement in motor vehicles.

10. The Hall sensor as claimed in claim 1, wherein the measuring device is configured to form the total measurement signal by forming a sum and arctangent of the first measurement signal, the second measurement signal, and the third measurement signal.

* * * * *